US008179644B2

(12) United States Patent  
Huang et al.

(10) Patent No.: US 8,179,644 B2
(45) Date of Patent: May 15, 2012

(54) TWO-WAY ELECTROSTATIC DISCHARGE PROTECTION CIRCUIT

(75) Inventors: Chin-Hai Huang, Taoyuan County (TW); Wei-Long Li, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 899 days.

(21) Appl. No.: 12/189,208

(22) Filed: Aug. 11, 2008

(65) Prior Publication Data

US 2009/0174975 A1    Jul. 9, 2009

(30) Foreign Application Priority Data

Jan. 9, 2008  (TW) ............................. 97100868 A
Mar. 11, 2008  (TW) ............................. 97108504 A

(51) Int. Cl.
*H02H 9/00* (2006.01)
(52) U.S. Cl. ........................................................ 361/56
(58) Field of Classification Search .................... 361/56
See application file for complete search history.

(56) References Cited

U.S. PATENT DOCUMENTS

| 5,606,340 | A | 2/1997 | Suzuki et al. | |
| 5,671,026 | A | 9/1997 | Shiraki et al. | |
| 5,714,900 | A * | 2/1998 | Ehlers | 327/325 |
| 6,587,160 | B2 | 7/2003 | Lee et al. | |
| 7,164,568 | B2 * | 1/2007 | Walters | 361/111 |
| 7,375,724 | B2 * | 5/2008 | Jiang et al. | 345/204 |
| 2008/0106835 | A1 * | 5/2008 | Ker et al. | 361/56 |
| 2008/0123004 | A1 * | 5/2008 | Lin et al. | 349/40 |
| 2010/0245012 | A1 * | 9/2010 | Chang | 336/200 |

FOREIGN PATENT DOCUMENTS

| CN | 101064984 | 10/2007 |
| JP | 05-203902 | 8/1993 |
| TW | I268597 | 12/2006 |
| WO | WO 2004072941 A2 * | 8/2004 |

OTHER PUBLICATIONS

"First Office Action of China Counterpart Application", issued on Aug. 10, 2010, p1-p3, in which the listed reference was cited.

* cited by examiner

*Primary Examiner* — Ronald W Leja
(74) *Attorney, Agent, or Firm* — Jianq Chyun IP Office

(57) ABSTRACT

An electrostatic discharge (ESD) protection circuit electrically connected to a first conductive line and a second conductive line is provided. The ESD protection circuit has a first ESD protection circuit unit, wherein the first ESD circuit unit includes a first coupled capacitor and a first active device. The first coupled capacitor includes a first electrode and a second electrode, wherein the first electrode is electrically connected to the first conductive line. The first active device includes a first gate, a first source and a first drain, wherein the first gate is electrically connected to the second electrode. In addition, the first source and the first electrode are electrically connected to the first conductive line, and the first drain is electrically connected to the second conductive line. Therefore, the conduction efficiency of the ESD protection circuit is improved.

10 Claims, 7 Drawing Sheets

TWO-WAY ELECTROSTATIC DISCHARGE PROTECTION CIRCUIT

CROSS-REFERENCE TO RELATED APPLICATION

This application claims the priority benefits of Taiwan applications serial no. 97108504, filed on Mar. 11, 2008 and serial no. 97100868, filed on Jan. 9, 2008. The entirety of each of the above-mentioned patent application is hereby incorporated by reference herein and made a part of this specification.

BACKGROUND OF THE INVENTION

1. Field of the Invention

The present invention relates to an active device array substrate. More particularly, the present invention relates to an active device array substrate having an electrostatic discharge (ESD) protection capability.

2. Description of Related Art

In the fabrication of liquid crystal displays, operators, machines, or testing instruments are prone to carry electrostatic charges. When the above charge-carrying entities (operators, machines, or testing instruments) come into contact with a liquid crystal display panel, the devices and circuits inside the liquid crystal display panel may be damaged by ESD. Therefore, ESD protection circuits are usually designed in the peripheral circuit region of the liquid crystal display panel. For active matrix liquid crystal display panels, the ESD protection circuits are generally formed on the substrate during the fabrication of the active device arrays, and the active device arrays are electrically connected to the ESD protection circuits. As such, when the liquid crystal display panel is impacted by ESD, the ESD protection circuits may dissipate or alleviate the electrostatic charges, so as to prevent the electrostatic charges from directly impacting the devices and circuits inside a display region.

FIG. 1A illustrates a schematic view of a conventional active device array substrate. Referring to FIG. 1A, an active device array substrate 110 has a display region A and a peripheral circuit region B. The active device array substrate 110 mainly comprises a substrate 112, a plurality of scan lines 114, a plurality of data lines 116, a plurality of pixel units 118, a shorting bar 120, a plurality of ESD protection circuits 122, and a plurality of pads 124. The scan lines 114 and the data lines 116 are disposed on the substrate 112, and the pixel units 118 are disposed in the display region A. Specifically, the scan lines 114 and the data lines 116 are electrically connected to the pixel units 118 so that voltage signals can be transmitted to the pixel units 118 through the scan lines 114 and the data lines 116. In addition, the scan lines 114 and the data lines 116 are electrically connected to the corresponding pads 124.

As shown in FIG. 1A, the shorting bar 120 is disposed in the peripheral circuit region B, and electrically connected to one end of the ESD protection circuit 122. The other end of the ESD protection circuit 122 is electrically connected to the corresponding scan line 114 and data line 116. Specifically, when ESD phenomenon occurs on the substrate 112, the electrostatic charges are dispersed through the shorting bar 120 to avoid the accumulation of the electrostatic charges. In another aspect, the ESD protection circuit 122 consumes the energy of the electrostatic charges to alleviate the ESD impact.

FIG. 1B illustrates a schematic view of an ESD protection circuit disclosed in Taiwan Patent No. TWI268597. Referring to FIG. 1B, an ESD protection circuit 200 is electrically connected to a signal line 210 and a shorting bar 220. The ESD protection circuit 200 comprises a first active device T1, a second active device T2, a third active device T3, a fourth active device T4, a fifth active device T5, and a sixth active device T6, wherein each of the active devices T1, T2, T3, T4, T5, and T6 has a corresponding gate G, a corresponding source S, and a corresponding drain D. As shown in FIG. 1B, the first active device T1, the second active device T2, and the third active device T3 constitutes a positive electrostatic protection module 230, while the fourth active device T4, the fifth active device T5, and the sixth active device T6 constitutes a negative electrostatic protection module 240. When ESD phenomenon occurs, a bi-directional dispersion of the electrostatic charges is achieved through the positive electrostatic protection module 230 or the negative electrostatic protection module 240 to avoid the accumulation of electrostatic charges. In another aspect, the ESD protection circuit 200 consumes the energy of the electrostatic charges to alleviate the ESD impact.

FIG. 1C illustrates a schematic view of another conventional ESD protection circuit. Referring to FIG. 1C, an ESD protection circuit 250 is electrically connected to a signal line 260 and a shorting bar 270. The ESD protection circuit 250 comprises a first active device T1 and a second active device T2, wherein each of the active devices T1 and T2 has a corresponding gate G, a corresponding source S, and a corresponding drain D. As shown in FIG. 1C, the first active device T1 is a positive electrostatic protection module 280, and the second active device T2 is a negative electrostatic protection module 290. When ESD phenomenon occurs, a bi-directional dispersion of the electrostatic charges is achieved through the positive electrostatic protection module 280 or the negative electrostatic protection module 290 to avoid the accumulation of electrostatic charges. In another aspect, the ESD protection circuit 250 consumes the energy of the electrostatic charges to alleviate the ESD impact.

However, in general, the amount of the electrostatic conduction current of the ESD protection circuit is significantly affected by the width to length ratio (W/L) of the active devices as in the case of the ESD protection circuit 200 or the ESD protection circuit 250 described above. Therefore, in practice, the width to length ratio of the active devices is usually increased to enhance the protection capability of the ESD protection circuit. As the electrostatic conduction current of the ESD protection circuit increases the efficiency of the electrostatic dispersion improved. It should be noted that increasing the width to length ratio of the active devices increases the amount of current of the electrostatic conduction current, which, however, would occupy a larger circuit layout area and thus limit the layout space for other circuits on the active device array substrate. In another aspect, under the low voltage in normal operations, the larger the width to length ratio of the active devices is, the higher the leakage current of the ESD protection circuit is. As a result, the normal display of the liquid crystal display panels is affected.

SUMMARY OF THE INVENTION

Accordingly, the present invention provides an ESD protection circuit with the advantages of a low leakage current and a reduced layout area.

To specifically describe the present invention, an ESD protection circuit is provided, wherein the ESD protection circuit is electrically connected to a first conductive line and a second conductive line, and has a first ESD protection circuit unit comprising a first active device, a second active device, and a third active device. The first active device comprises a first source, a first drain, and a first gate, wherein the first source and the first gate are electrically connected to the first conductive line. The second active device comprises a second source, a second drain, and a second gate, wherein the second gate is electrically connected to the first conductive line, the second source is electrically connected to the first drain, and the second drain is electrically connected to an electrostatic output terminal. The third active device comprises a third source, a third drain, and a third gate, wherein the third drain is electrically connected to the first drain and the second source, and the third source and the third gate are electrically connected to the second conductive line.

The present invention further provides an active device array substrate comprising a display region and a peripheral circuit region outside the display region, a substrate, a plurality of pixel units, a plurality of first conductive lines, a plurality of second conductive lines and a plurality of ESD protection circuits. The plurality of pixel units is arranged on the substrate and inside the display region. The plurality of first conductive lines is disposed on the substrate and inside the display region. The first conductive lines are electrically connected to the pixel units and extended to the peripheral circuit region. The plurality of second conductive lines is disposed on the substrate and inside the peripheral circuit region. The plurality of ESD protection circuits is disposed on the substrate and inside the peripheral circuit region. The ESD protection circuits are electrically connected to the first conductive lines and the second conductive lines. Each of the respective ESD protection circuits comprises a first ESD protection circuit unit, wherein each of the respective ESD protection circuit units comprises a first active device, a second active device, and a third active device. The first active device comprises a first source, a first drain, and a first gate, wherein the first source and the first gate are electrically connected to the first conductive line. The second active device comprises a second source, a second drain, and a second gate, wherein the second gate is electrically connected to the first conductive line, the second source is electrically connected to the first drain, and the second drain is electrically connected to the second conductive line. The third active device comprises a third source, a third drain, and a third gate, wherein the third drain is electrically connected to the first drain and the second source, and the third source and the third gate are electrically connected to the second conductive line.

In an embodiment of the present invention, each ESD protection unit further comprises a second ESD protection circuit unit comprising a fourth active device, a fifth active device, and a sixth active device. The fourth active device comprises a fourth source, a fourth drain, and a fourth gate, wherein the fourth source and the fourth gate are electrically connected to the second conductive line. The fifth active device comprises a fifth source, a fifth drain, and a fifth gate, wherein the fifth gate is electrically connected to the second conductive line, the fifth source is electrically connected to the fourth drain, and the fifth drain is electrically connected to the first conductive line. The sixth active device comprises a sixth source, a sixth drain, and a sixth gate, wherein the sixth drain is electrically connected to the fourth drain and the fifth source, and the sixth source and the sixth gate are electrically connected to the first conductive line.

In an embodiment of the present invention, the first conductive line comprises a signal line which comprises a scan line and a data line.

In an embodiment of the present invention, the second conductive line comprises a shorting bar.

The present invention further provides an ESD protection circuit electrically connected to a first conductive line and a second conductive line. The ESD protection circuit comprises a first ESD protection circuit unit comprising a first coupled capacitor and a first active device. The first coupled capacitor comprises a first electrode and a second electrode, wherein the first electrode is electrically connected to the first conductive line. The first active device comprises a first gate, a first source, and a first drain, wherein the first gate and the second electrode are electrically connected, the first source, the first electrode, and the first conductive line are electrically connected, and the first drain and the second conductive line are electrically connected.

In an embodiment of the present invention, each ESD protection circuit unit further comprises a second ESD protection circuit unit comprising a second coupled capacitor and a second active device. The second coupled capacitor comprises a third electrode and a fourth electrode, wherein the third electrode is electrically connected to the second conductive line. The second active device comprises a second gate, a second source, and a second drain, wherein the second gate and the fourth electrode are electrically connected the second source, the third electrode, and the second conductive line are electrically connected, and the second drain and the first conductive line are electrically connected.

The present invention further provides an ESD protection circuit electrically connected to a first conductive line and a second conductive line and comprises an ESD protection circuit unit. The ESD protection circuit unit comprises a plurality of circuit modules connected in series, each circuit module comprising a first coupled capacitor and a first active device. The first coupled capacitor comprises a first electrode and a second electrode. The first active device comprises a first gate, a first source, and a first drain, wherein the first gate and the second electrode are electrically connected, the first source, the first electrode, and the first drain of the previous stage circuit module are electrically connected. The first electrode of the first stage of the above mentioned circuit modules connected in series is electrically connected to the first conductive line. The first drain of the last stage of the circuit modules connected in series is electrically connected to the second conductive line.

In an embodiment of the present invention an ESD protection circuit further comprises a second ESD protection circuit unit comprising a second coupled capacitor and a second active device. The second coupled capacitor comprises a third electrode and a fourth electrode. The second active device comprises a second gate, a second source, and a second drain, wherein the second gate and the fourth electrode are electrically connected, and the second source, the third electrode, and the second drain of the previous stage circuit module are electrically connected. The third electrode of the first stage of the above mentioned circuit modules connected in series is electrically connected to the second conductive line. The second drain of the last stage of the circuit modules connected in series is electrically connected to the first conductive line.

In an embodiment of the present invention, the first conductive line comprises a signal line which is a scan line or a data line.

In an embodiment of the present invention, the second conductive line is a shorting bar.

The ESD protection circuit unit of the present invention has high electrostatic conduction efficiency to enable the electrostatic current dispersing in a widespread area. In addition, the low dependency between the conduction capability of the ESD protection circuit unit of the present invention and the width to length ratio of the active devices results in a significant reduction of the layout area. In another aspect, the ESD protection circuit of the present invention comprises two identical ESD protection circuit units arranged in different direction and has a bidirectional conduction capability to prevent the active device array substrate from being damaged by electrostatic charges and to improve the fabricating yield.

To make the above and other objectives, features, and advantages of the present invention more comprehensible, several embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2:
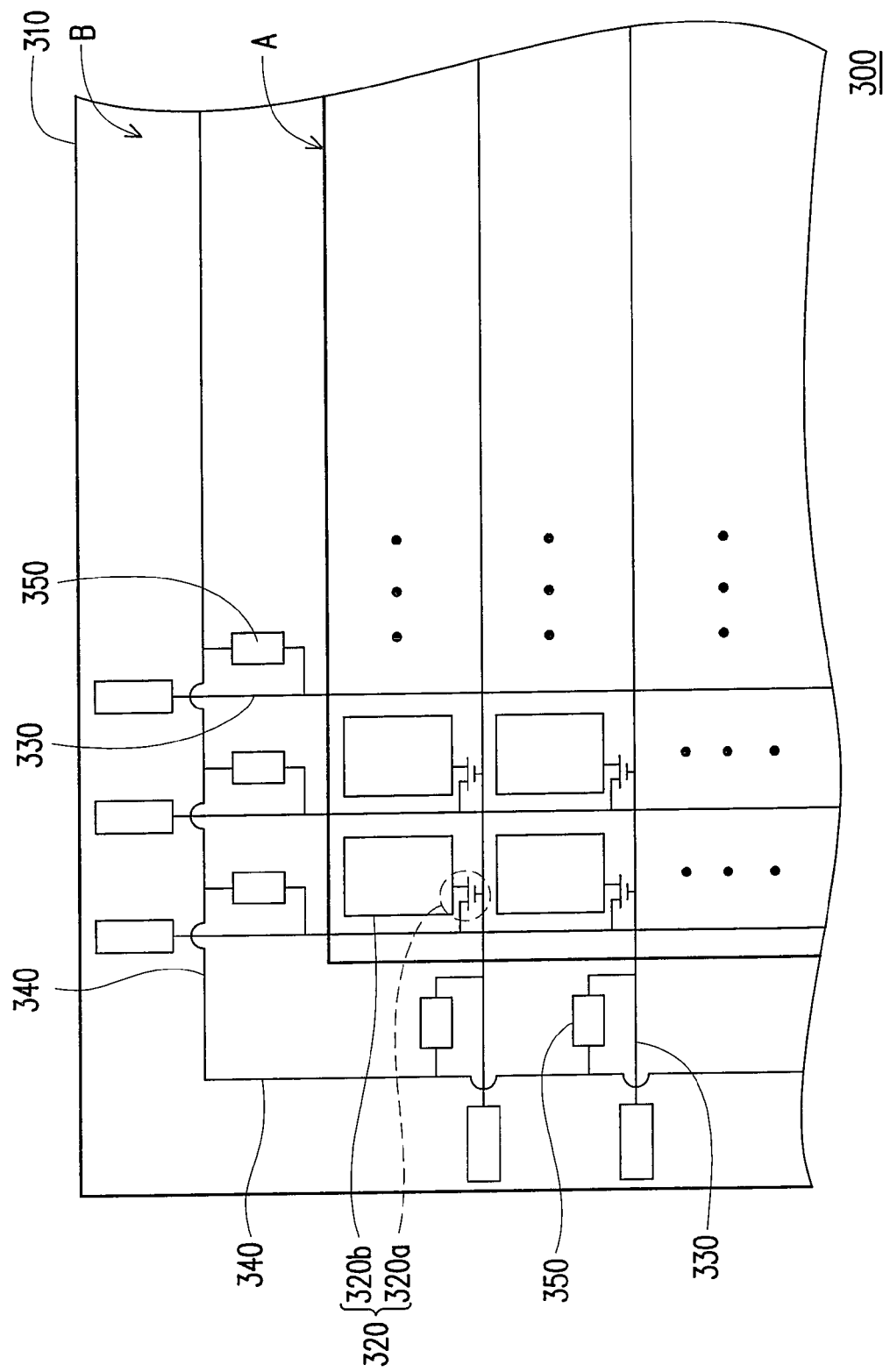
FIG. 2 is a schematic view of an active device array substrate according to the present invention.

FIG. 2 is a schematic view a of an active device array substrate according to the present invention. Referring to FIG. 2, an active device array substrate 300 has a display region A and a peripheral circuit region B outside the display region A. The active device array substrate 300 comprises a substrate 310, a plurality of pixel units 320, a plurality of first conductive lines 330, a plurality of second conductive lines 340, and a plurality of ESD protection circuits 350. The plurality of pixel units 320 are arranged on the substrate 310 and inside the display region A. In general, each of the pixel units 320 comprises at least an active device 320a and a pixel electrode 320b, wherein the active device 320a is electrically connected to the pixel electrode 320b. It should be noted that the number of the active devices 320a and the pixel electrodes 320b depends on the design of the pixel unit 320. For example, one pixel unit 320 with a pre-charge design may require two or more active devices 320a, while the pixel unit 320 with a design aimed at improving color shift may require two or more pixel electrodes 320b. Thus, the number of the active devices 320a and the pixel electrodes 320b in each pixel unit 320 is not limited herein.

As shown in FIG. 2, the plurality of first conductive lines 330 is disposed on the substrate 310 within the display region A. The first conductive lines 330 are electrically connected to the pixel units 320 and extended to the peripheral circuit region B, wherein the first conductive lines 330 are, for example, signal lines which may be scan lines or data lines. The plurality of second conductive lines 340 are disposed on the substrate 310 within the peripheral circuit region B, wherein the second conductive lines 340 are, for example, shorting bars. Furthermore, the plurality of ESD protection circuits 350 is disposed on the substrate 310 and inside the peripheral circuit region B wherein the ESD protection circuits 350 are electrically connected to the first conductive lines 330 and the second conductive lines 340.

Figure 3:
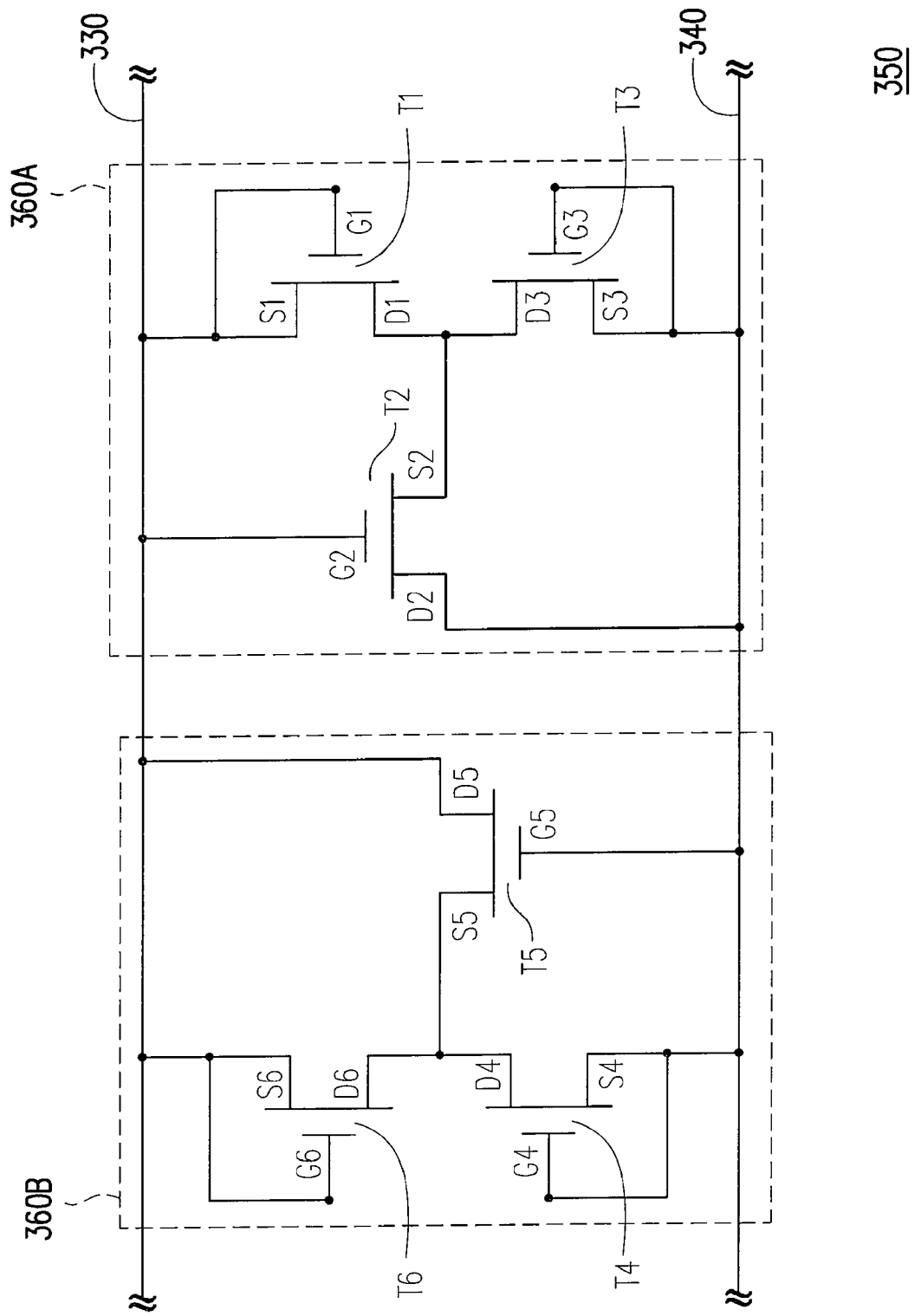
FIG. 3 is a schematic view of an ESD protection circuit according to an embodiment of the present invention.

FIG. 3 is a schematic view of an ESD protection circuit according to the present invention. Referring to FIG. 3, the ESD protection circuits 350 are electrically connected to one first conductive line 330 and one second conductive line 340. The ESD protection circuit 350 includes a first ESD protection circuit unit 360A comprising a first active device T1, a second active device T2, and a third active device T3. It should be noted that in the present embodiment, the ESD protection circuit 350 further comprises a second ESD protection circuit unit 360B, wherein the second ESD protection circuit unit 360B is electrically connected to the first conductive line 330 and the second conductive line 340 and comprises a fourth active device T4, a fifth active device T5, and a sixth active device T6.

Specifically, the first ESD protection circuit unit 360A comprises the first active device T1, the second active device T2, and the third active device T3. The first active device T1 comprises a first source S1, a first drain D1, and a first gate G1, wherein the first source S1 and the first gate G1 are electrically connected to the first conductive line 330. The second active device T2 comprises a second source S2, a second drain D2, and a second gate G2, wherein the second gate G2 is electrically connected to the first conductive line 330, the second source S2 is electrically connected to the first drain D1, and the second drain D2 is electrically connected to the second conductive line 340. The third active device T3 comprises a third drain D3, a third source S3, and a third gate G3, wherein the third drain D3 is electrically connected to the first drain D1 and the second source S2, and the third source S3 and the third gate G3 are electrically connected to the second conductive line 340.

In another aspect, the second ESD protection circuit unit 360B comprises the fourth active device T4, the fifth active device T5, and the sixth active device T6. The fourth active device T4 comprises a fourth source S4, a fourth drain D4, and a fourth gate G4, wherein the fourth source S4 and the fourth gate G4 are electrically connected to the second conductive line 340. The fifth active device T5 comprises a fifth source S5, a fifth drain D5, and a fifth gate G5, wherein the fifth gate G5 is electrically connected to the second conductive line 340, the fifth source S5 is electrically connected to the fourth drain D4, and the fifth drain D5 is electrically connected to the first conductive line 330. The sixth active device T6 comprises a sixth source S6, a sixth drain D6, and a sixth gate G6, wherein the sixth drain D6 is electrically connected to the fourth drain D4 and the fifth source S5, and the sixth source S6 and the sixth gate G6 are electrically connected to the first conductive line 330. It should be noted that the active devices T1, T2, T3, T4, T5, and T6 are, for example, thin film transistors (TFTs). The positions of the sources S1, S2, S3, S4, S5 and S6 and the drains D1, D2, D3, D4, D5, and D6 corresponding to the respective active devices T1, T2, T3, T4, T5, and T6 are dependent upon the type of the TFT, which are not limited by the present invention.

Specifically, in the present embodiment, the first ESD protection circuit unit 360A and the second ESD protection circuit unit 360B are respectively formed by connecting three sets of the active devices. Taking the first ESD protection circuit unit 360A as an example, the first ESD protection circuit unit 360A is capable to disperse the electrostatic charges occurring in the first conductive line 330 to the second conductive line 340 through a path from the first active device T1 to the second active device T2 or to the third active device T3. In another aspect, the second ESD protection circuit unit 360B is suitable to disperse the electrostatic charges occurring in the second conductive line 340 to the first conductive line 330 through a path from the fourth active device T4 to the fifth active device T5 or to the sixth active device T6. In other words, in the present embodiment, the ESD protection circuit 350 has a bi-directional conduction capability. Certainly, the ESD protection circuit 350 may also be formed by only the first ESD protection circuit unit 360A.

Specifically, referring to FIG. 3, when ESD phenomenon occurs in the first conductive line 330, the electrostatic charges flow into the first ESD protection circuit unit 360A. The high voltage instantly generated by ESD turns on the first active device T1 and causes the electrostatic charges to flow from the first source S1 to the first drain D1. In practice, the energy of the electrostatic charges is effectively consumed after turning on the first active device T1, which alleviates the damage caused by the ESD. If the energy of the ESD is great, the damage of the ESD may be alleviated again by the second active device T2. Then, the electrostatic charges are dispersed through the second conductive line 340 so as to further alleviate the impact of the ESD. The electrostatic charges from the first conductive line 330 are dispersed and consumed by the first ESD protection circuit unlit 360A. Thus, this prevents the respective devices connected to the first conductive line 330, such as the pixel units 320 (shown in FIG. 2), from being directly impacted by the ESD and avoids the occurrence of short circuit between the first conductive line 330 and other devices (e.g. the pixel units 320 shown in FIG. 2). For example, when the first conductive line 330 and the second conductive line 340 are a signal line and a shorting bar, respectively, the electrostatic charges occurring on the signal line may dissipate to the shorting bar through the above mentioned first ESD protection circuit unit 360A so as to provide protection for the devices (e.g. the pixel units 320 shown in FIG. 2) in the display region A of the active device array substrate 310 (shown in FIG. 2) to maintain normal display of images. The said signal line may be a scan line or a data line.

In another aspect, when ESD phenomenon occurs on the second conductive line 340, the electrostatic charges flow into the second ESD protection circuit unit 360B. The high voltage instantly generated by ESD may turn on the fourth active device T4 and the fifth active device T5 in sequence. Then, the electrostatic charges flow into the first conductive line 330 through the turned-on fourth active device T4 and the turned-on fifth active device T5 so as to dissipate the electrostatic charges through the first conductive line 330 and to further alleviate the impact of the ESD. The electrostatic charges from the second conductive line 340 are dispersed and consumed by the second ESD protection circuit unit 360B. Thus, this prevents the respective devices (not shown) electrically connected to the second conductive line 340 from being directly impacted by the ESD and avoids the occurrence of short circuit between the second conductive line 340 and other devices. In other words, in the present embodiment, the ESD protection circuit 350 enables the bi-directional dispersion of the electrostatic charges of the first conductive line 330 and the second conductive line 340 so as to dissipate the ESD impact on the respective devices at the moment of ESD occurrence.

Figure 1A:
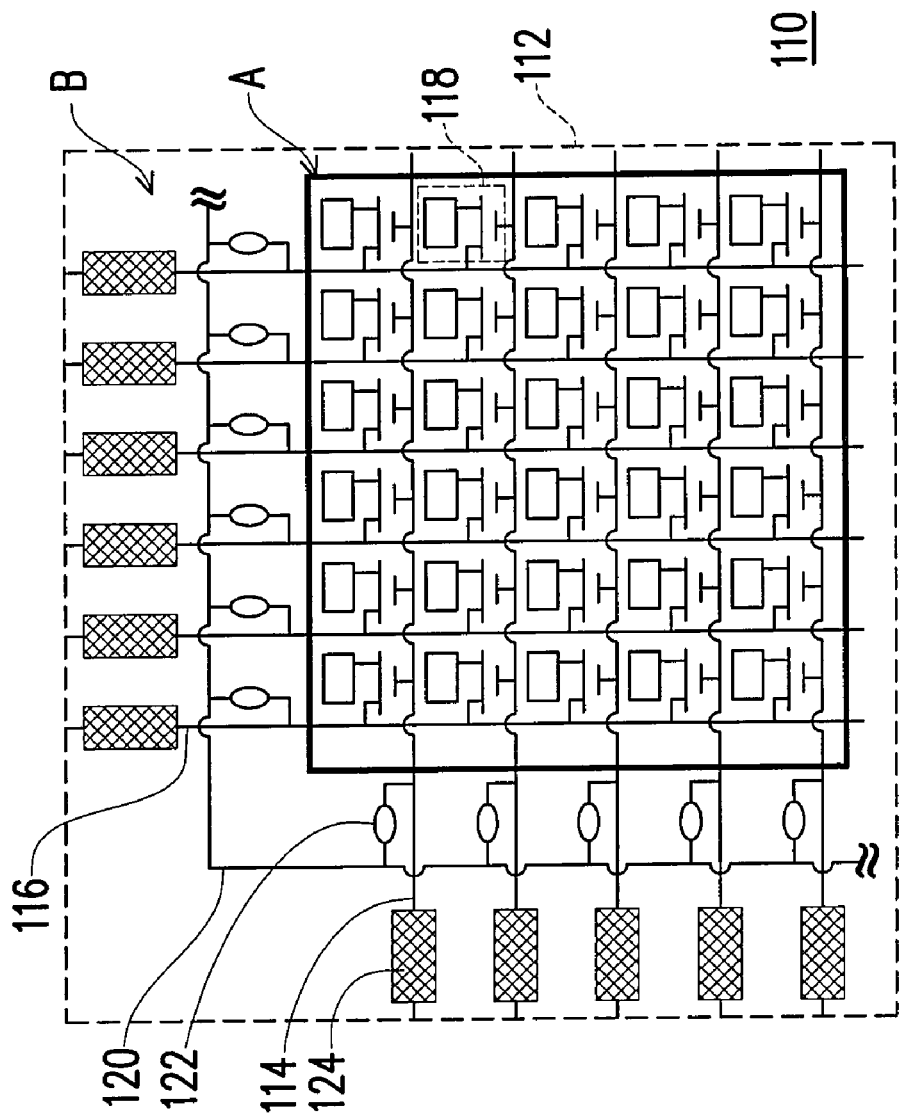
FIG. 1A is a schematic view of a conventional active device array substrate.
Figure 1B:
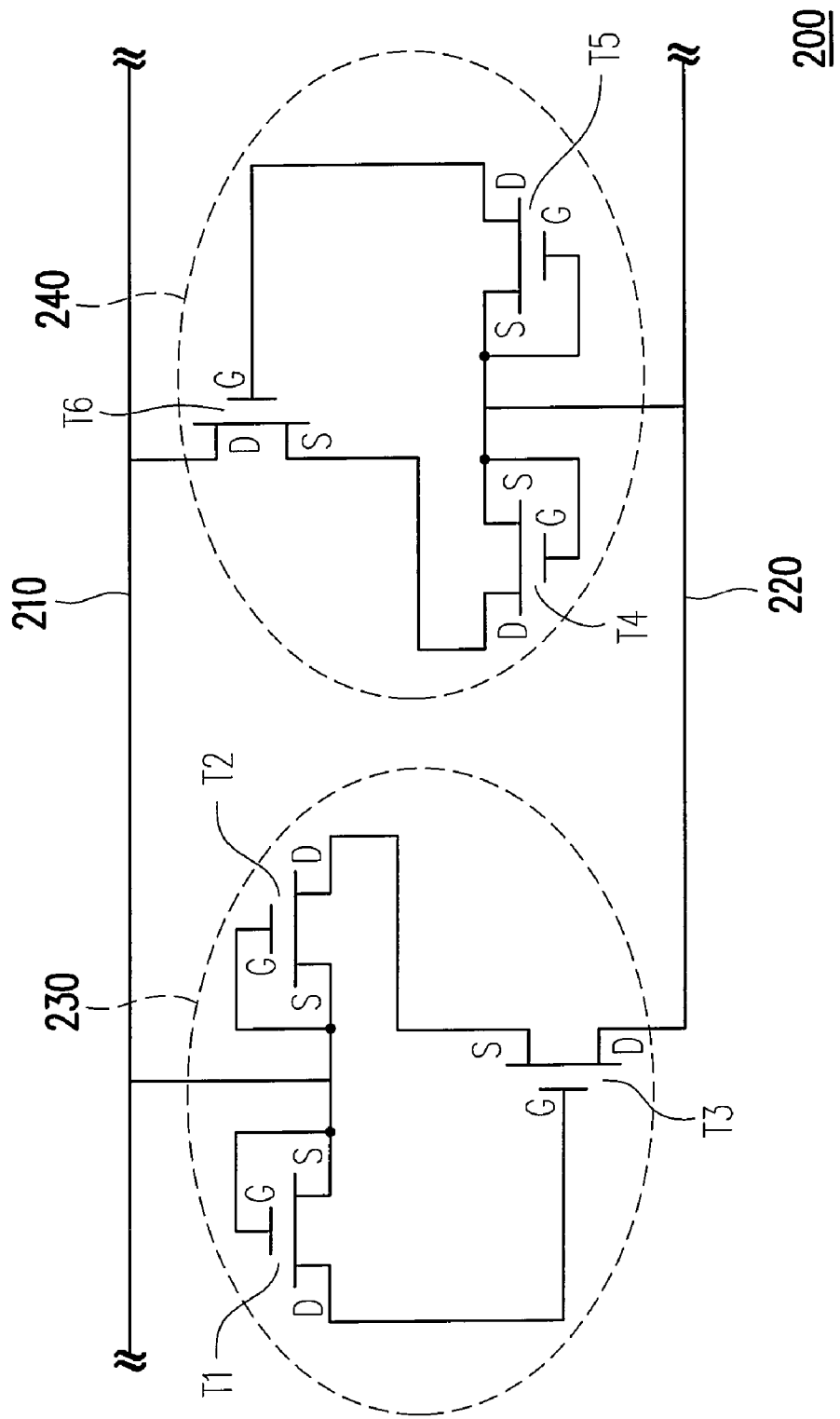
FIG. 1B to FIG. 1C are schematic views of a conventional ESD protection circuit.

It should be noted that the electrostatic dispersion path of the first ESD protection circuit unit 360A includes two active devices. In other words, the dispersion effect is achieved when the electrostatic charges turn on the first active device T1 and the second active device T2. Therefore, compared to an electrostatic path in the prior art which includes three active devices, the present invention provides better electrostatic conduction efficiency and thus, better ESD protection capability. Simulations of ESD currents, under various active device width to length ratios of the ESD protection circuit 350 and the conventional ESD protection circuit 200 (shown in FIG. 1B) are illustrated hereunder.

TABLE 1

| electrostatic current mA active device width to length ratio | the ESD protection circuit 350 | | the conventional ESD protection circuit 200 | |
|---|---|---|---|---|
| | +200 V | −200 V | +200 V | −200 V |
| 50/7 | 4.772181 | 1.62289 | 0.3 | 0.26 |
| 21/7 | 4.595558 | 1.46846 | 0.13 | 0.11 |
| 7/7 | 4.509927 | 1.39393 | 0.042 | 0.037 |
| 3.5/7 | 4.488578 | 1.37525 | 0.021 | 0.018 |

Table 1 illustrates the electrostatic current of the ESD protection circuit 350 and the conventional ESD protection circuit 200 (shown in FIG. 1B) simulated at a high electrostatic voltage. Referring to table 1, when the electrostatic charge is at 200V, the electrostatic current of the ESD protection circuit 350 is approximately 4.4 mA to 4.7 mA. Compared to the electrostatic current of 0.01 mA to 0.26 mA of the conventional ESD protection circuit 200, the ESD protection circuit 350 significantly increases the electrostatic conduction efficiency. Thus, compared to the prior art, the ESD protection circuit 350 of the present invention has a better ESD protection capability. In addition, from Table 1, the electrostatic current of the ESD protection circuit 350 has a low dependency on the active device width to length ratio. The ESD protection circuit in the prior art has a high dependency on the active device width to length ratio. It is required to increase the active device width to length ratio in order to raise the electrostatic conduction efficiency. The active device width to length ratio may be greatly reduced in the ESD protection circuit 350 of the present embodiment. In other words, the active device width to length ratio of the ESD protection circuit 350 of the present invention may be designed with a smaller value to reach better electrostatic conduction efficiency and to significantly reduce the layout area, accordingly.

TABLE 2

| mA active device width to length ratio | the ESD protection circuit 350 | |
|---|---|---|
| | +5 V | −5 V |
| 50/7 | 2.7E−4 | 2.6E−5 |
| 21/7 | 1.1E−4 | 1.1E−5 |
| 7/7 | 3.9E−5 | 3.7E−6 |
| 3.5/7 | 2.0E−5 | 1.9E−6 |

Table 2 illustrates the electrostatic current of the ESD protection circuit 350 simulated at a low electrostatic voltage. From Table 2, when the electrostatic charge is at 5V, the electrostatic current of the ESD protection circuit 350 is very low. Alternatively speaking, the ESD protection circuit 350 of the present embodiment does not have the problem of an overly large leakage current under normal operation voltage.

In addition, to further increase the ESD protection capability of the ESD protection circuit 350 of the present invention, the third active device T3 and the sixth active device T6 are respectively disposed on the first ESD protection circuit unit 360A and the second ESD protection circuit unit 360B to provide the ESD protection circuit 350 with a second protection capability. For example, in the case when the second active device T2 of the first ESD protection circuit unit 360A fails to work, the third active device T3 may function as an alternative path for dissipating the electrostatic charges to ensure the dispersion effect of the ESD protection circuit 350 and the ESD protection capability.

Figure 4:
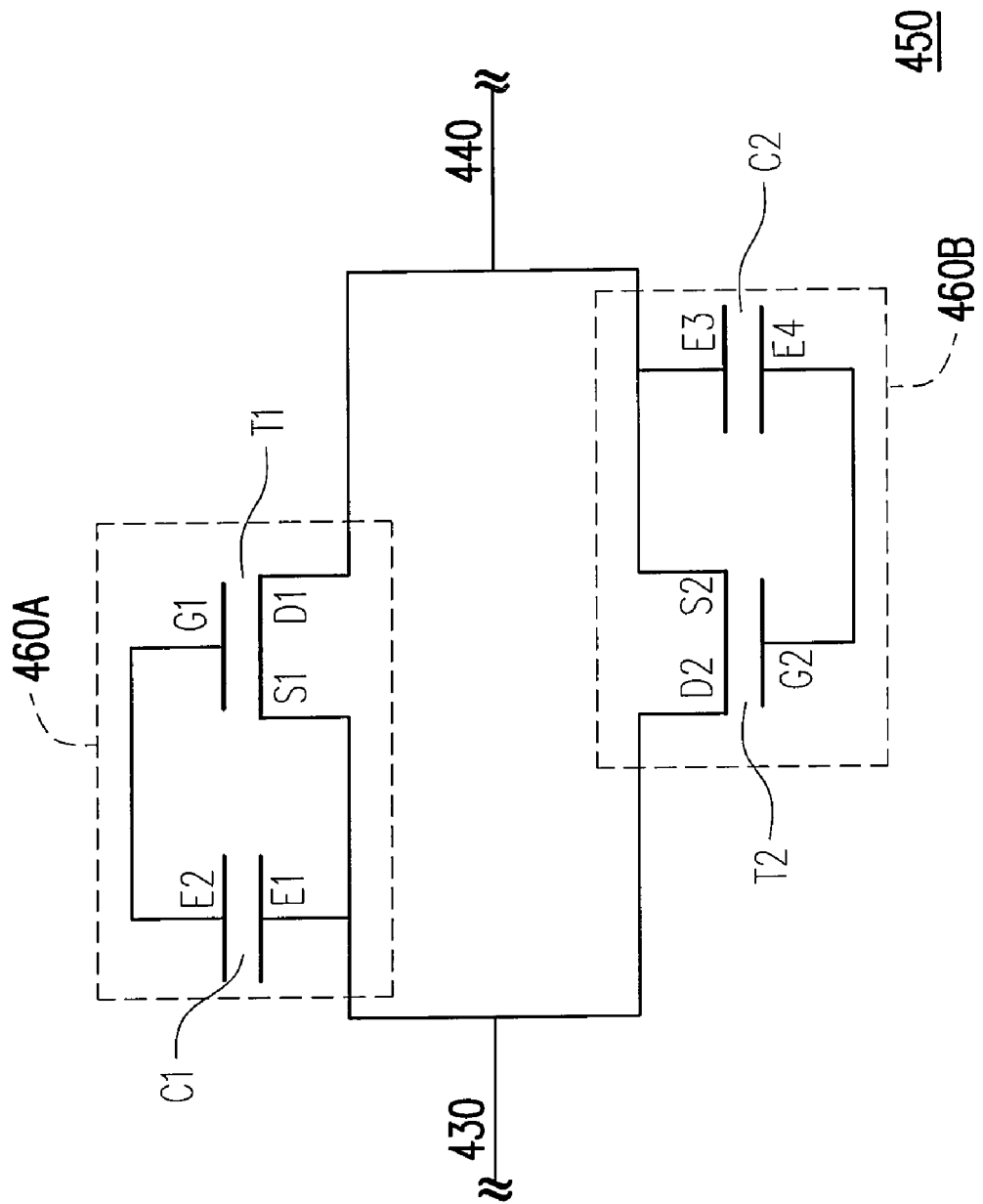
FIG. 4 is a schematic view of an ESD protection circuit according to an embodiment of the present invention.

FIG. 4 is a schematic view of an ESD protection circuit according to an embodiment of the present invention. Referring to FIG. 4, an ESD protection circuit 450 is electrically connected to a first conductive line 430 and a second conductive line 440. The ESD protection circuit 450 comprises a first ESD protection circuit unit 460A, wherein the first ESD protection circuit unit 460A comprises a first coupled capacitor C1 and a first active device T1. Furthermore, in the present embodiment, the ESD protection circuit unit 450 further comprises a second ESD protection circuit unit 460B, wherein the second ESD protection circuit unit 460B comprises a second coupled capacitor C2 and a second active device T2.

Specifically, the first ESD protection circuit unit 460A comprises the first coupled capacitor C1 and the first active device T1. The first coupled capacitor C1 comprises a first electrode E1 and a second electrode E2, wherein the first electrode E1 is electrically connected to the first conductive line 430 in addition, the first active device T1 comprises a first gate G1, a first source S1, and a first drain D1, wherein the first gate G1 and the second electrode E2 are electrically connected, the first source S1, the first electrode E1, and the first conductive line 430 are electrically connected, and the first drain D1 and the second conductive line 440 are electrically connected.

In another aspect, the second ESD protection circuit unit 460B comprises the second coupled capacitor C2 and the second active device T2. The second coupled capacitor C2 comprises a third electrode E3 and a fourth electrode E4, wherein the third electrode E3 is electrically connected to the second conductive line 440. The second active device T2 comprises a second gate G2, a second source S2, and a second drain D2, wherein the second gate 62 and the fourth electrode E4 are electrically connected, the second source S2, the third electrode E3, and the second conductive line 440 are electrically connected, and the second drain D2 and the first conductive line 430 are electrically connected. Similarly, the active devices T1 and T2 are, for example, TFT. The configuration positions of the sources S1 and S2 and the drains D1 and D2 corresponding to the respective active devices T1 and T2 are dependent upon the type of the TFTs, which are not limited by the present invention.

Specifically, in the present embodiment, the first ESD protection circuit unit 460A and the second ESD protection circuit unit 460B are respectively formed by connecting a set of the coupled capacitors and a set of the active devices in series. Taking the first ESD protection circuit unit 460A as an example, the first ESD protection circuit unit 460A is suitable to disperse the electrostatic charges occurring on the first conductive line 430 to the second conductive line 440 via a path from the first coupled capacitor C1 to the first active device T1. In another aspect, the second ESD protection circuit unit 460B is suitable to disperse the electrostatic charges occurring on the second conductive line 440 to the first conductive line 430 via a path from the second coupled capacitor C2 to the second active device T2. Alternatively speaking, in the present embodiment, the ESD protection circuit 450 has a bi-directional conduction capability. Certainly, the ESD protection circuit 450 may also be formed by only the first ESD protection circuit unit 460A.

Please refer to FIG. 4 again. When ESD phenomenon occurs on the first conductive line 430, the electrostatic charges first flow into the first ESD protection circuit unit 460A. In particular, the first coupled capacitor C1 in the first ESD protection circuit unit 460A effectively increases the conduction efficiency of the first active device T1 when ESD phenomenon occurs. A voltage difference is therefore formed between the first gate G1 and the first source S1 of the first active device T1 so as to turn on the first active device T1, to further instantly relay the electrostatic charges from the first source S1 to the first drain D1, and to disperse the electrostatic charges to the second conductive line 440 in order to further alleviate the impact of ESD.

In practice, the energy of the electrostatic charges is effectively consumed after turning on the first coupled capacitor C1 and the first active device T1, which reduces the damage caused by the ESD. Thus, this prevents the respective devices connected to the first conductive line 430, such as the pixel units 320 (shown in FIG. 2) from being directly impacted by the ESD and avoids the occurrence of short circuit between the first conductive line 430 and other devices (e.g. the pixel units 320 shown in FIG. 2). For example, when the first conductive line 430 and the second conductive line 440 are a signal line and a shorting bar, respectively, the electrostatic charges occurring on the signal line may dissipate to the shorting bar through the above mentioned first ESD protection circuit unit 460A so as to provide protection for the devices (e.g. the pixel units 320 shown in FIG. 2) in the display region A of the active device array substrate 310 (shown in FIG. 2) to maintain normal display of images. The said signal line may be a scan line or a data line.

When ESD phenomenon occurs on the second conductive line 440, the electrostatic charges flow into the lower second ESD protection circuit unit 460B. The dispersion path of the electrostatic charges dissipating from the second ESD protection circuit unit 460B to the first conductive line 430 is similar to the above illustration, which will not be further described.

Figure 1C:
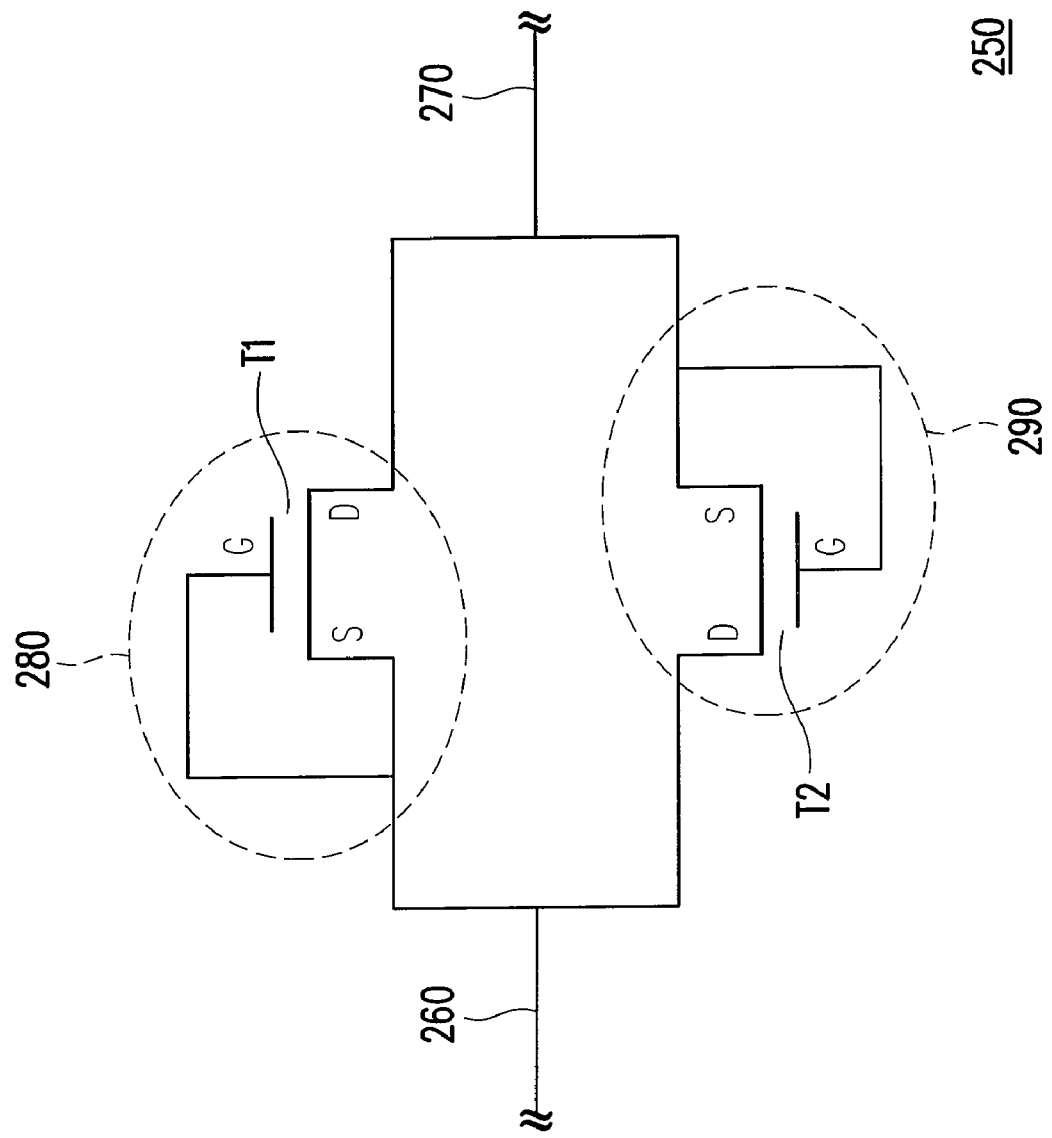

It should be noted that the respective coupled capacitors C1 and C2 of the ESD protection circuit units 460A and 460B facilitate the turn-on of the active devices T1 and T2 in the occurrence of ESD. In other words, the ESD protection circuit 450 in the present embodiment has better electrostatic conduction efficiency, compared to the ESD protection circuit 250 (shown in FIG. 1C) in the prior art. Table 3 illustrates a simulation of ESD current, under a same active device width to length ratio, of the ESD protection circuit 450 according to the present embodiment and the conventional ESD protection circuit 250 (shown in FIG. 1C).

TABLE 3

| electrostatic current A | 2000 V | 4 V |
|---|---|---|
| the ESD protection circuit 450 | 16.35 | 82.09E-9 |
| the ESD protection circuit 250 | 0.183 | 12.19E-9 |

Referring to Table 3, when the electrostatic charge is at 2000V, the electrostatic current of the ESD protection circuit 450 in the present embodiment is 100 times that of the conventional ESD protection circuit 250. Thus, the ESD protection circuit 450 in the present embodiment provides a significant increase of the electrostatic conduction efficiency. Furthermore, from Table 3, the ESD protection circuit 450 does not have the problem of an over large electrostatic current under normal operation voltage. Therefore, damage to the active device array substrate caused by ESD may be effectively prevented under the normal operation of the ESD protection circuit 450 of the present embodiment without affecting image display quality. Compared with the prior art, the present embodiment provides effective dispersion of the electrostatic charges without the need to increase the active device width to length ratio. In other words, the active device width to length ratio of the ESD protection circuit 450 of the present invention may be designed with a smaller value to reach better electrostatic conduction efficiency and to significantly reduce layout area, accordingly.

Figure 5:
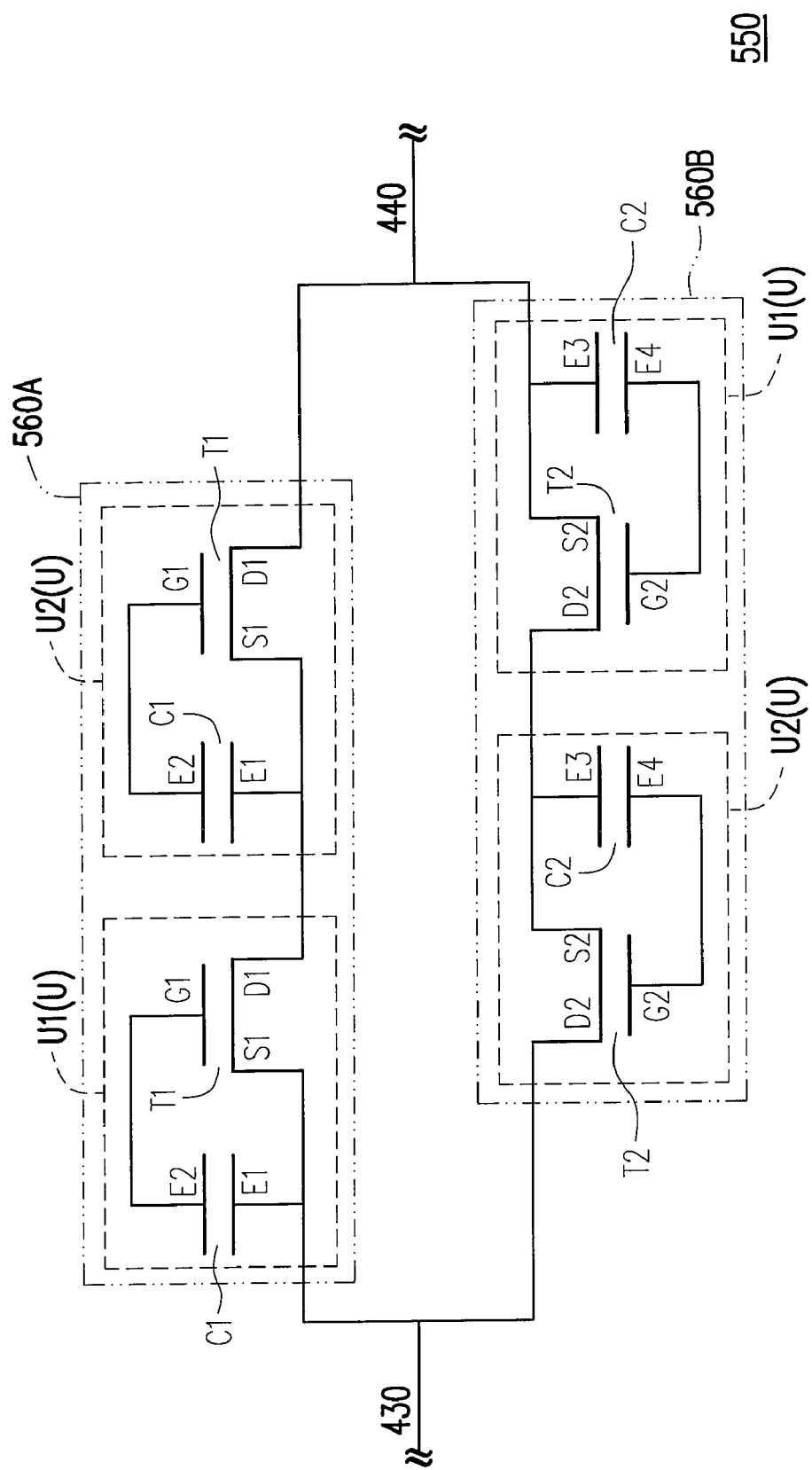
FIG. 5 is a schematic view of an ESD protection circuit according to an embodiment of the present invention.

It should be noted that the aforementioned combination of the coupled capacitors C1 and C2 and the active devices T1 and T2 may be deemed as a circuit module U. In practice, if the energy of the ESD is considerable, a plurality of serially connected circuit modules U may be disposed on the respective ESD protection circuit units 460A and 460B. As shown in FIG. 5, the ESD protection circuit units 460A and 460B are respectively configured with two circuit modules U for example.

Specifically, FIG. 5 is a schematic view of an ESD protection circuit according to an embodiment of the present invention. Referring to FIG. 5, an ESD protection circuit 550 is similar to the ESD protection circuit 450. The ESD protection circuit 550 of the present embodiment comprises a first ESD protection circuit unit 560A, wherein the first ESD protection circuit unit 560A comprises a plurality of serially connected circuit modules U. Each of the said circuit modules U respectively comprises a first coupled capacitor C1 and a first active device T1. The first coupled capacitor C1 comprises a first electrode E1 and a second electrode E2. The first active device T1 comprises a first gate G1, a first source S1, and a first drain D1, wherein the first gate G1 and the second electrode E2 are electrically connected, the first source S1, the first electrode E1, and the first drain D1 of the previous stage circuit module are electrically connected. The first electrode E1 of the first stage of the above mentioned serially connected circuit modules is electrically connected to the first conductive line 430. The first drain D1 of the last stage of the serially connected circuit modules is electrically connected to the second conductive line 440.

In another aspect, in the present embodiment, the ESD protection circuit 550 further comprises a second ESD protection circuit unit 560B, wherein the second ESD protection circuit unit 560B comprises a second coupled capacitor C2 and a second active device T2. The second coupled capacitor C2 comprises a third electrode E3 and a fourth electrode E4. The second active device T2 comprises a second gate G2, a second source S2, and a second drain D2, wherein the second gate G2 and the fourth electrode E4 are electrically connected, and the second source S2, the third electrode E3, and the second drain D2 of the previous stage circuit module are electrically connected. The third electrode E3 of the first stage of the above mentioned serially connected circuit modules is electrically connected to the second conductive line 440. The second drain D2 of the last stage of the serially connected circuit modules is electrically connected to the first conductive line 430.

Referring to FIG. 5 again, when ESD phenomenon occurs on the side of the first conductive line 430, the electrostatic charges may dissipate through the first ESD protection circuit unit 560A and to the second conductive line 440. Specifically, the energy of the electrostatic charges is effectively consumed after turning on the first coupled capacitor C1 of a first stage circuit module U1 and the first active device T1, which reduces the damage caused by the ESD. If the energy of the ESD is considerable, the damage of the ESD may be further reduced by the first coupled capacitor C1 of a next stage circuit module U2 and the first active device T1. The electrostatic charges occurring on the side of the first conductive line 430 may dissipate through the first ESD protection circuit unit 560A and to the second conductive line 440. In another aspect, the electrostatic charges occurring on the side of the second conductive line 440 may dissipate through the second ESD protection circuit unit 560B and to the first conductive line 430 to alleviate the impact of the ESD on the respective devices on the substrate (shown in FIG. 2).

Accordingly, the ESD protection circuit of the present invention provides good electrostatic conduction efficiency enabling the dispersion of electrostatic current in a large area. In addition, the conduction capability of the ESD protection circuit unit of the present invention is less affected by the width to length ratio of the active devices and thus significantly reduces the layout area. Furthermore, the ESD protection circuit of the present invention provides a bidirectional conduction capability to prevent the active device array substrate from being damaged by the ESD and to improve the fabricating yield.

It will be apparent to those of ordinary skills in the technical field that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An ESD protection circuit electrically connected to a first conductive line and a second conductive line and comprising a first ESD protection circuit unit, wherein the first ESD protection circuit unit comprises:
   a first active device comprising a first source, a first drain, and a first gate, wherein the first source and the first gate are electrically connected to the first conductive line;
   a second active device comprising a second source, a second drain, and a second gate, wherein the second gate is electrically connected to the first conductive line, the second source is electrically connected to the first drain, and the second drain is electrically connected to the second conductive line; and
   a third active device comprising a third source, a third drain, and a third gate, wherein the third drain is electrically connected to the first drain and the second source, and the third source and the third gate are electrically connected to the second conductive line.

2. The ESD protection circuit according to claim 1, further comprising a second ESD protection circuit unit, wherein the second ESD protection circuit unit comprises:
   a fourth active device comprising a fourth source, a fourth drain, and a fourth gate, wherein the fourth source and the fourth gate are electrically connected to the second conductive line;
   a fifth active device comprising a fifth source, a fifth drain, and a fifth gate, wherein the fifth gate is electrically connected to the second conductive line, the fifth source is electrically connected to the fourth drain, and the fifth drain is electrically connected to the first conductive line; and
   a sixth active device comprising a sixth source, a sixth drain, and a sixth gate, wherein the sixth drain is electrically connected to the fourth drain and the fifth source, and the sixth source and the sixth gate are electrically connected to the first conductive line.

3. The ESD protection circuit according to claim 1, wherein the first conductive line comprises a signal line.

4. The ESD protection circuit according to claim 3, wherein the signal line comprises a scan line or a data line.

5. The ESD protection circuit according to claim 1, wherein the second conductive line comprises a shorting bar.

6. An active device array substrate, having a display region and a peripheral circuit region outside the display region, wherein the active device array substrate comprises:

a substrate;

a plurality of pixel units arranged on the substrate and inside the display region;

a plurality of first conductive lines disposed on the substrate and inside the display region, wherein the first conductive lines are electrically connected to the pixel units and extended to the peripheral circuit region;

a plurality of second conductive lines disposed on the substrate and inside the peripheral circuit region;

a plurality of ESD protection circuits disposed on the substrate and inside the peripheral circuit region and electrically connected to the first conductive lines and the second conductive lines, wherein each of the respective ESD protection circuits has a first ESD protection circuit unit comprising:

a first active device comprising a first source, a first drain, and a first gate, wherein the first source and the first gate are electrically connected to the first conductive line;

a second active device comprising a second source, a second drain, and a second gate, wherein the second gate is electrically connected to the first conductive line, the second source is electrically connected to the first drain, and the second drain is electrically connected to the second conductive line; and a third active device comprising a third source, a third drain, and a third gate, wherein the third drain is electrically connected to the first drain and the second source, and the third source and the third gate are electrically connected to the second conductive line.

7. The active device array substrate according to claim 6, wherein each of the respective ESD protection circuits further has a second ESD protection circuit unit comprising:

a fourth active device comprising a fourth source, a fourth drain, and a fourth gate, wherein the fourth source and the fourth gate are electrically connected to the second conductive line;

a fifth active device comprising a fifth source, a fifth drain, and a fifth gate, wherein the fifth gate is electrically connected to the second conductive line, the fifth source is electrically connected to the fourth drain, and the fifth drain is electrically connected to the first conductive line; and a sixth active device comprising a sixth source, a sixth drain, and a sixth gate, wherein the sixth drain is electrically connected to the fourth drain and the fifth source, and the sixth source and the sixth gate are electrically connected to the first conductive line.

8. The active device array substrate according to claim 6, wherein the first conductive line comprises a signal line.

9. The active device array substrate according to claim 8, wherein the signal line comprises a scan line or a data line.

10. The active device array substrate according to claim 6, wherein the second conductive line comprises a shorting bar.

* * * * *